(12) United States Patent
Chien et al.

(10) Patent No.: US 11,335,721 B2
(45) Date of Patent: May 17, 2022

(54) BACKSIDE ILLUMINATED IMAGE SENSOR DEVICE WITH SHIELDING LAYER

(71) Applicant: TAIWAN SEMICONDUCTOR MANUFACTURING CO., LTD., Hsinchu (TW)

(72) Inventors: Volume Chien, Tainan (TW); Su-Hua Chang, Chiayi County (TW); Chia-Yu Wei, Tainan (TW); Zen-Fong Huang, Tainan (TW); Chi-Cherng Jeng, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/073,580

(22) Filed: Nov. 6, 2013

(65) Prior Publication Data

US 2015/0123225 A1 May 7, 2015

(51) Int. Cl.
*H01L 27/146* (2006.01)
*H01L 31/0216* (2014.01)

(52) U.S. Cl.
CPC .... *H01L 27/1464* (2013.01); *H01L 27/14623* (2013.01); *H01L 27/14627* (2013.01); *H01L 27/14632* (2013.01); *H01L 27/14687* (2013.01); *H01L 31/02164* (2013.01)

(58) Field of Classification Search
CPC ........... H01L 27/1464; H01L 27/14687; H01L 27/14623; H01L 27/14632; H01L 27/14627; H01L 31/02165; H01L 27/3272; H01L 27/14818; G02F 1/136209; G02F 1/133512
See application file for complete search history.

(56) References Cited

U.S. PATENT DOCUMENTS

| | | | | |
|---|---|---|---|---|
| 5,128,786 A | * | 7/1992 | Yanagisawa | G02F 1/133512 349/111 |
| 7,382,011 B2 | * | 6/2008 | Noda | H01L 27/14621 257/292 |
| 2005/0030399 A1 | * | 2/2005 | Suzuki | H01L 27/14609 348/294 |
| 2006/0202295 A1 | * | 9/2006 | Wu | H01L 27/14623 257/432 |
| 2007/0023799 A1 | * | 2/2007 | Boettiger | 257/292 |
| 2007/0205354 A1 | * | 9/2007 | Li | 250/208.1 |
| 2009/0090988 A1 | * | 4/2009 | Ohgishi | H01L 27/14887 257/432 |

(Continued)

OTHER PUBLICATIONS

Hitosugi et al., "Properties of TiO2-based transparent conductive oxides", Phys. Status Solidi A 207, No. 7, 1529-2537 (2010).*

(Continued)

*Primary Examiner* — Vincent Wall
(74) *Attorney, Agent, or Firm* — Birch, Stewart, Kolasch & Birch, LLP

(57) ABSTRACT

A backside illuminated image sensor device with a shielding layer and a manufacturing method thereof are provided. In the backside illuminated image senor device, a patterned conductive shielding layer is formed on a dielectric layer on a backside surface of a semiconductor substrate and surrounding a pixel array on a front side surface of the semiconductor substrate.

20 Claims, 4 Drawing Sheets

(56) References Cited

U.S. PATENT DOCUMENTS

| | | | |
|---|---|---|---|
| 2009/0251573 A1* | 10/2009 | Toyoda | H01L 27/14627 348/273 |
| 2010/0193845 A1* | 8/2010 | Roy et al. | 257/228 |
| 2010/0214453 A1* | 8/2010 | Murata | G02B 3/0056 348/266 |
| 2012/0120294 A1* | 5/2012 | Nishikido | H04N 5/378 348/308 |
| 2013/0221410 A1* | 8/2013 | Ahn | 257/225 |
| 2013/0329271 A1* | 12/2013 | Shim | G02B 26/02 359/230 |

OTHER PUBLICATIONS

U.S. Appl. No. 61/788,472, filed Mar. 15, 2013.

* cited by examiner

BACKSIDE ILLUMINATED IMAGE SENSOR DEVICE WITH SHIELDING LAYER

BACKGROUND

Technical Field

The disclosure generally relates to image sensors, especially CMOS image sensors.

Description of Related Art

An image sensor provides an array of pixels for recording an intensity or brightness of light. The pixel responds to the light by accumulating a charge. The more light is received, the higher the charge is accumulated. The charge can then be used by another circuit so that information of color and brightness can be used for a suitable application, such as a digital camera. Common types of pixels include a charge-coupled device (CCD) or complementary metal oxide semiconductor (CMOS) image sensor.

Comparing with conventional front-side illuminated (FSI) sensor, backside illuminated (BSI) sensor has been applied on CMOS image sensor to improve the sensitivity of each pixel in the CMOS image sensor. For CMOS image sensor using backside illumination technology, pixels are located on a front side of a substrate, and the substrate is thinned enough to allow light projected on the backside of the substrate to reach the pixels.

However, during the manufacturing process of the BSI sensor, electrostatic charges are often accumulated, and the wafer used can be easily damaged by the accumulated electrostatic charges in a form of arcing to decrease the yield of the BSI sensor.

DETAILED DESCRIPTION

Figure 1A:
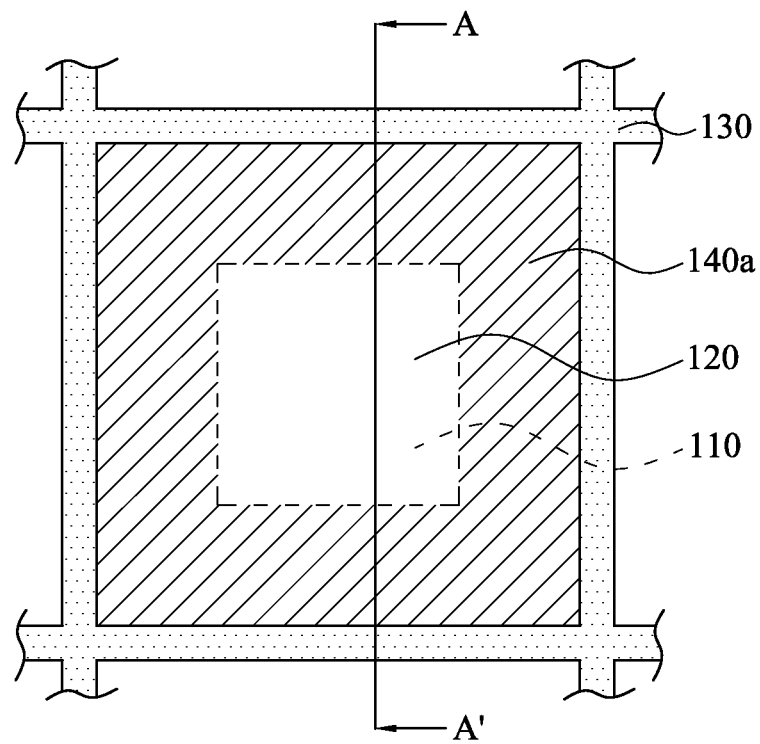
FIGS. 1A-1C are plane diagrams of a backside illuminated image sensor device with a conductive shielding layer according to embodiments of this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the process of manufacturing a backside illuminated image sensor device, it is found that a step of developing a photoresist layer on a dielectric layer can generate electrostatic charge accumulated on the dielectric layer. The accumulated electrostatic charge can induce discharging later in any time to damage the pixel array under the dielectric layer. Accordingly, it is designed to form a conductive shielding layer on the dielectric layer to shielding the structures under the conductive shielding layer from outer applied electric field, which may present in a plasma-assisted deposition step or in a plasma-assisted etching step. Then, the discharging behavior of the accumulated electrostatic charges can be reduced or even be prevented.

In various embodiments, this disclosure provides a backside illuminated image sensor device with a conductive shielding layer for shielding the structures under the conductive shielding layer from outer applied electric field.

Figure 1B:
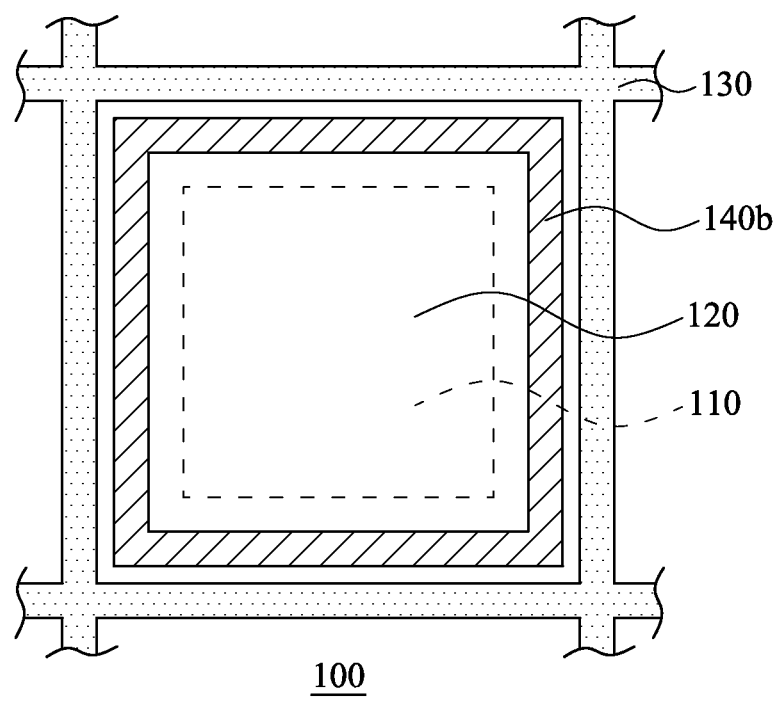
Figure 1C:
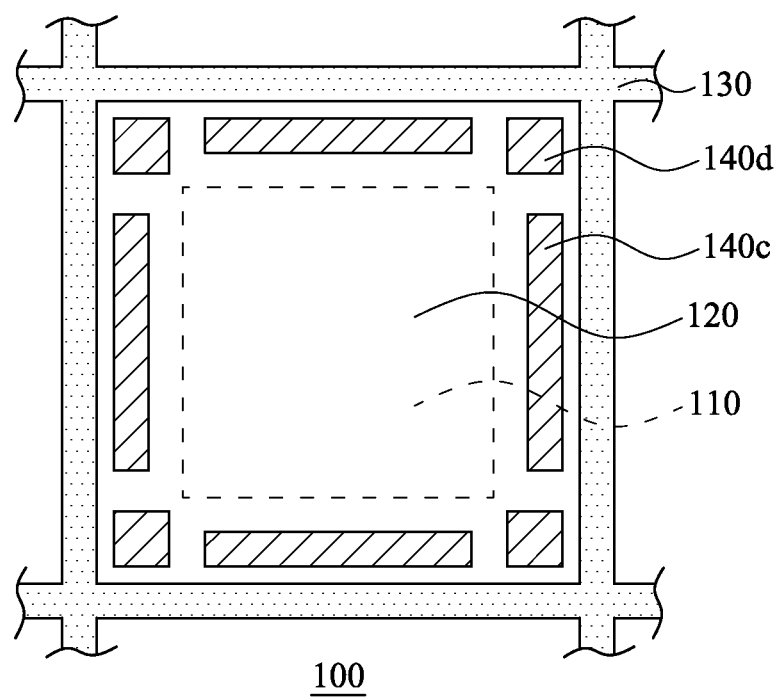

FIGS. 1A-1C are plane diagrams of a backside illuminated image sensor device with a conductive shielding layer according to some embodiments of this disclosure. A cross-sectional diagram of the cutting line AA' is shown in FIG. 2B.

Figure 2A:
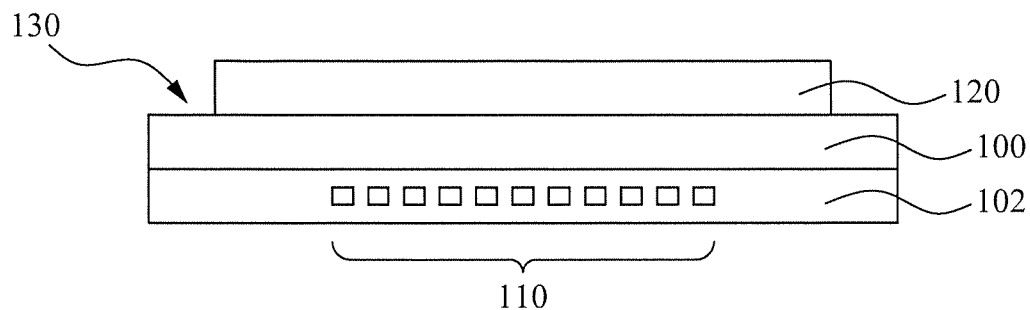
FIGS. 2A-2C are cross-sectional diagrams showing a manufacturing process of a backside illuminated image sensor device with a conductive shielding layer in FIG. 1A.
Figure 2B:
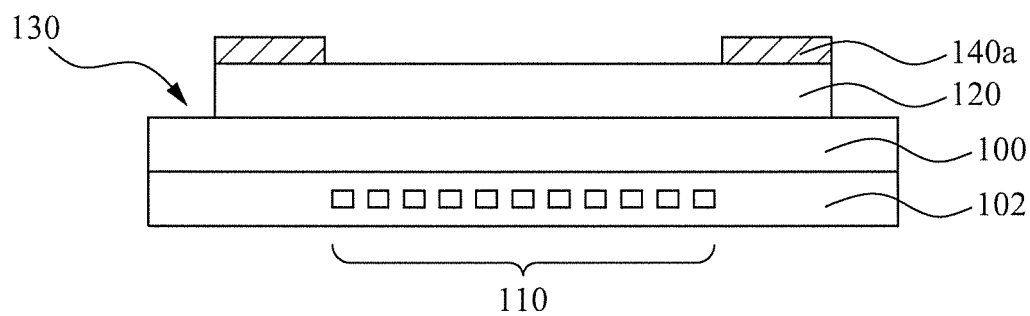

In FIGS. 1A and 2B, a pixel array 110 is disposed on a front surface of a wafer 100. The pixel array 110 includes photodiodes (not shown) in the semiconductor substrate 100 and metal lines in the interconnect layer 102. A dielectric layer 120 is disposed on a back surface of the wafer 100 to cover the backside of the pixel array 110. A plurality of scribe lines 130 are formed in the dielectric layer 120.

A conductive shielding line 140a is disposed on the dielectric layer 120. The conductive shielding line 140a is located on an area between the pixel array 110 and scribe lines 130 and fills the area. Therefore, the conductive shielding line 140a does not stop light irradiating on the pixel array 110 to maximize the light intensity received by the pixel array 110.

In FIG. 1B, the conductive shielding line 140a in FIG. 1A is thinned to the conductive shielding line 140b. However, for maintaining the shielding effect, the line width of the conductive shielding line 140b is at least 300 µm.

The conductive shielding line 140a in FIG. 1A can be further patterned to any patterns as long as the distributed conductive shielding lines is surrounding the pixel array 110 to give protection to the pixel array 110. The shape of the each individual conductive shielding lines viewed from a top direction can be circle, square, polygon, or strip. Still, the narrowest width of the each individual conductive shielding lines is at least 300 µm. For example, the conductive shielding line 140a in FIG. 1A can be patterned to conductive shielding lines 140c in a shape of strip and conductive shielding lines 140d in a shape of square in FIG. 10.

According to an embodiment of this disclosure, the conductive shielding lines 140a to 140d can be made from a conductive material, such as a metal, a conductive oxide, a conductive polymer, or graphene. The metal can be Al, Cu, Ti, Mo, or a MoCr alloy. The conductive oxide can be AZO (ZnO: Al), GZO (ZnO: Ga), GAZO (ZnO: Ga, Al), ATO ($SnO_2$: Sb), FTO ($SnO_2$: F), or ITO ($In_2O_3$: Sn). The conductive polymer can be poly(3,4-ethylenedioxythiophene) (PEDOT), polyanilines (PANI), or corresponding intrinsically conducting polymers (ICPs).

According to another embodiment of this disclosure, the dielectric layer is made from a dielectric material having a dielectric constant higher than or equal to the dielectric constant of silicon oxide. For example, the dielectric layer can be made from silicon oxide or silicon nitride.

According to another embodiment of this disclosure, the dielectric buffer layer is made from a dielectric material, such as silicon oxide.

Figure 2C:
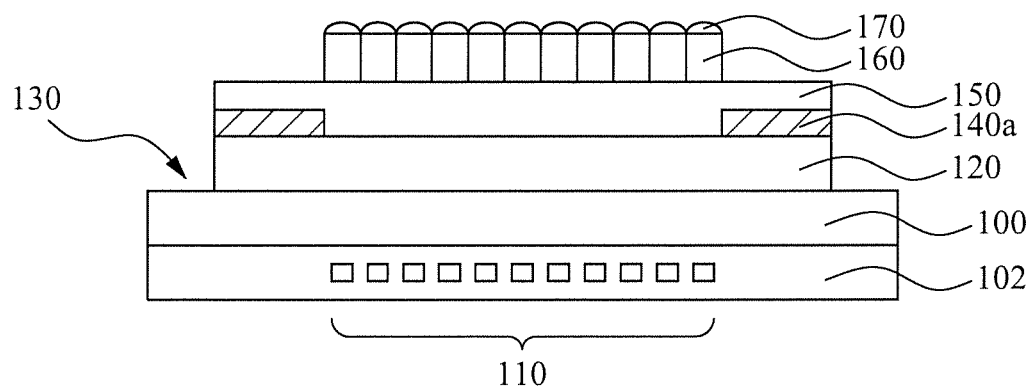
Figure 3:
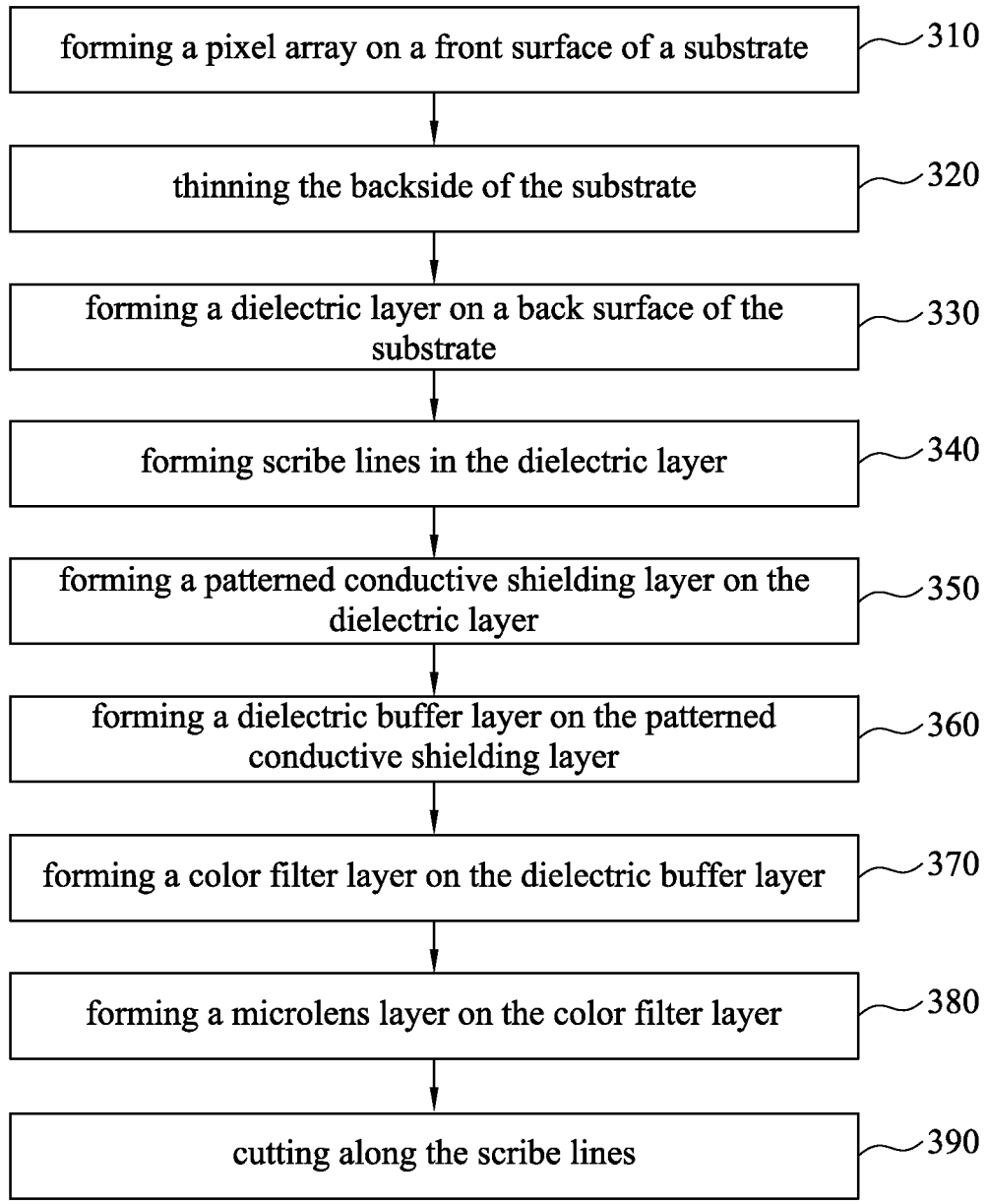
FIG. 3 is a flow chart showing the manufacturing process of a backside illuminated image sensor device with a conductive shielding layer in FIGS. 2A-2C.

In other embodiments, this disclosure provides a method of manufacturing a backside illuminated image sensor device. The backside illuminated image sensor device with a conductive shielding layer in FIG. 1A is taken as an example. Therefore, FIGS. 2A-2C are cross-sectional diagrams showing a manufacturing process of a backside illuminated image sensor device with a conductive shielding layer in FIG. 1A. In addition, FIG. 3 is a flow chart showing the manufacturing process of a backside illuminated image sensor device with a conductive shielding layer in FIGS. 2A-2C. FIGS. 2A-2C and FIG. 3 are referred hereinafter at the same time.

In FIG. 2A and step 310, the pixel array 110 is formed on the front surface of the semiconductor substrate 100. The pixel array 110 includes photodiodes (not shown) in the semiconductor substrate 100 and metal lines in the interconnect layer 102.

In FIG. 2A and step 320, the backside of the substrate 100 is then thinned to reduce the thickness of the substrate 100 to allow light strike the photodiodes in the substrate 100. Next in step 330, a dielectric layer 120 is formed on the back surface of the substrate 100.

In FIG. 2A and step 340, scribe lines 130 are formed in the dielectric layer 120 by patterning the dielectric layer 120. The method of patterning the dielectric layer 120 can be photolithography and etching. In the step of developing photoresist in the photolithography process, since photoresist and the dielectric layer both are electrically insulating material, friction between two insulating materials often produces electrostatic charges to be accumulated. The accumulated electrostatic charges may damage the pixel array 110 if no prevention or protection treatment is made.

In FIG. 2B and step 350, a conductive shielding line 140a is formed on the dielectric layer 120 to protect the structures under the conductive shielding line 140a from discharging damage. The conductive shielding line 140a can be formed by depositing a conductive shielding layer, and then patterning the conductive shielding layer by a method such as photolithography and etching processes. Since the light received intensity by the photodiodes is better to be maximized, the conductive shielding layer 120 is better not cover the backside of the pixel array 110. However, if the conductive shielding line 140a is transparent to light, the conductive shielding line 140a may cover the backside of the pixel array 110 according to various embodiments of this disclosure.

In FIG. 2C and step 360, a dielectric buffer layer 150 is formed on the conductive shielding line 140a and dielectric layer 120. Next in step 370 and step 380, a color filter layer 160 and a microlens layer 170 are sequentially formed on the dielectric buffer layer 150. Finally, in step 390, the each individual backside illuminated image sensor is separated from each other by cutting along the scribe lines 130.

According to another embodiment of this disclosure, the conductive shielding lines 140b in FIG. 1B or 140c-140d in FIG. 10 can be formed through different photomask used in the above step of patterning the conductive shielding layer. The other steps are the same as the above-described process, and hence are omitted here.

Accordingly, since at least a conductive shielding line is located on the dielectric layer, any outer applied electric field cannot induce the charging effect of the electrostatic charges accumulated under the conductive shielding layer.

All the features disclosed in this specification (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A backside illuminated image sensor device, comprising:
    a semiconductor substrate;
    a dielectric layer disposed on a back surface of the semiconductor substrate;
    a conductive shielding line disposed on the dielectric layer and having a first sidewall and a second sidewall opposite to the first sidewall;
    a dielectric buffer layer disposed on the conductive shielding line and the dielectric layer, wherein the first sidewall of the conductive shielding line is coplanar with a first sidewall of the dielectric buffer layer, the dielectric buffer layer is in direct contact with the second sidewall of the conductive shielding line, and the first sidewall of the conductive shielding line is free from direct coverage by any portion of the dielectric buffer layer;
    a color filter layer disposed on the dielectric buffer layer, wherein the conductive shielding line is arranged between the dielectric layer and the color filter layer and surrounds a pixel array area in which a plurality of color filters are arranged, the second sidewall of the conductive shielding line and the color filters at a boundary of the pixel array area define a horizontal distance therebetween, and the pixel array area is void of the conductive shielding line; and
    a microlens layer disposed on the color filter layer.

2. The image sensor device of claim 1, further comprising a plurality of scribe lines in the dielectric layer.

3. The image sensor device of claim 2, wherein the conductive shielding line is located on an area between the pixel array area and the scribe lines and fills the area.

4. The image sensor device of claim 1, wherein the conductive shielding line is configured to prevent electrostatic charges.

5. The image sensor device of claim 1, wherein a portion of the dielectric layer under and in direct contact with the conductive shielding line has a sidewall coplanar with the first sidewall of the conductive shielding line.

6. The image sensor device of claim 5, wherein the first sidewall of the conductive shielding line is free from direct coverage by the portion of the dielectric layer.

7. A backside illuminated image sensor device, comprising:
    a semiconductor substrate;
    a dielectric layer disposed on a back surface of the semiconductor substrate;
    four patterned conductive shielding lines separated from each other, disposed on the dielectric layer, and respectively at four corners of a pixel array area;
    a dielectric buffer layer disposed on and in direct contact with the four patterned conductive shielding lines and the dielectric layer, wherein an entirety of the dielectric buffer layer is not lower than bottom surfaces of the four patterned conductive shielding lines;
    a color filter layer disposed on the dielectric buffer layer and including a plurality of color filters arranged in the pixel array area, wherein some of the color filters are positioned at a boundary of the pixel array area, an inner sidewall of a first one of the four patterned conductive shielding lines is aligned with sidewalls of the color filters at the boundary of the pixel array area, an outer sidewall of the first one of the four patterned conductive shielding lines is aligned with a sidewall of the dielectric layer, and an entirety of the dielectric buffer layer and an entirety of the dielectric layer are free of contact with the outer sidewall of the first one of the four patterned conductive shielding lines; and
    a microlens layer disposed on the color filter layer.

8. The image sensor device of claim 7, wherein a shape of each of the four patterned conductive shielding lines viewed from a top direction is circle, square, or strip.

9. The image sensor device of claim 7, wherein the outer sidewall of the first one of the four patterned conductive shielding lines is further aligned with a sidewall the dielectric buffer layer.

10. The image sensor device of claim 9, wherein the outer sidewall of the first one of the four patterned conductive shielding lines, the sidewall of the dielectric layer, and the sidewall the dielectric buffer layer are coterminous.

11. The image sensor device of claim 9, wherein the outer sidewall of the first one of the four patterned conductive shielding lines is higher than the sidewall of the dielectric layer and lower than the sidewall the dielectric buffer layer.

12. A backside illuminated image sensor device, comprising:
a semiconductor substrate;
a pixel array area disposed on a front surface of the semiconductor substrate;
a dielectric layer disposed on a back surface of the semiconductor substrate and a backside of the pixel array area;
a conductive shielding line disposed on the dielectric layer, the conductive shielding line having opposite inner sidewall and outer sidewall, wherein the pixel array area is void of the conductive shielding line;
a dielectric buffer layer disposed on the conductive shielding line and the dielectric layer, the dielectric buffer layer having an outer sidewall extending upwards from a topmost end of the outer sidewall of the conductive shielding line, wherein a topmost end of the outer sidewall of the dielectric buffer layer is higher than the topmost end of the outer sidewall of the conductive shielding line, and the outer sidewall of the dielectric buffer layer is coplanar with the outer sidewall of the conductive shielding line;
a color filter layer disposed on the dielectric buffer layer and including a plurality of color filters arranged in the pixel array area, wherein some of the color filters are positioned at a boundary of the pixel array area, the inner sidewall of the conductive shielding line is aligned with sidewalls of the color filters at the boundary of the pixel array; and
a microlens layer disposed on the color filter layer.

13. The image sensor device of claim 12, wherein the dielectric buffer layer is in direct contact with the dielectric layer.

14. The image sensor device of claim 13, wherein a portion of the dielectric buffer layer on the conductive shielding line is thinner than another portion of the dielectric buffer layer on the pixel array area.

15. The image sensor device of claim 12, wherein the dielectric buffer layer is in direct contact with the color filter layer and the conductive shielding line.

16. The image sensor device of claim 12, wherein a bottommost end of the outer sidewall of the dielectric buffer layer is vertically adjacent to the topmost end of the outer sidewall of the conductive shielding line.

17. The image sensor device of claim 12, wherein the outer sidewall of the conductive shielding line is further aligned with an outer sidewall of the dielectric layer.

18. The image sensor device of claim 17, wherein a bottommost end of the outer sidewall of the conductive shielding line is vertically adjacent to a topmost end of the outer sidewall of the dielectric layer.

19. The image sensor device of claim 12, wherein a bottommost end of the outer sidewall of the dielectric buffer layer is higher than the topmost end of the outer sidewall of the conductive shielding line.

20. The image sensor device of claim 12, wherein the outer sidewall of the dielectric buffer layer that is coplanar with the outer sidewall of the conductive shielding line is free from direct coverage by any portion of the conductive shielding line.

* * * * *